(12) United States Patent
Mouli et al.

(10) Patent No.: US 6,818,930 B2
(45) Date of Patent: Nov. 16, 2004

(54) GATED ISOLATION STRUCTURE FOR IMAGERS

(75) Inventors: Chandra Mouli, Boise, ID (US); Howard Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/291,728

(22) Filed: Nov. 12, 2002

(65) Prior Publication Data

US 2004/0092054 A1 May 13, 2004

(51) Int. Cl.[7] .................. H01L 29/74; H01L 29/747; H01L 31/06
(52) U.S. Cl. .................. 257/215; 257/223; 257/231; 257/249; 257/288; 257/292
(58) Field of Search .................. 257/215–223, 257/231, 249, 291, 292, 396, 446, 288, 461, 347, 233, 432, 447, 467; 438/60

(56) References Cited

U.S. PATENT DOCUMENTS

| | | | |
|---|---|---|---|
| 5,275,965 A | | 1/1994 | Manning |
| 5,386,128 A | | 1/1995 | Fossum et al. |
| 5,702,976 A | | 12/1997 | Schuegraf et al. |
| 5,798,544 A | | 8/1998 | Ohya et al. |
| 5,859,450 A | * | 1/1999 | Clark et al. .................. 257/233 |
| 6,084,635 A | * | 7/2000 | Nakamura .................. 348/302 |
| 6,141,264 A | | 10/2000 | Casper |
| 6,184,055 B1 | * | 2/2001 | Yang et al. .................. 438/57 |
| 6,242,782 B1 | | 6/2001 | Casper et al. |
| 6,301,172 B1 | | 10/2001 | Derner et al. |
| 6,350,127 B1 | * | 2/2002 | Chiang et al. .................. 434/48 |
| 6,351,002 B1 | * | 2/2002 | Pan .................. 257/233 |
| 6,395,576 B1 | * | 5/2002 | Chang et al. .................. 438/70 |
| 6,410,359 B2 | * | 6/2002 | Connolly et al. .................. 438/48 |
| 6,448,595 B1 | * | 9/2002 | Hsieh et al. .................. 257/292 |
| 6,495,391 B1 | * | 12/2002 | Chan .................. 438/59 |
| 6,514,785 B1 | * | 2/2003 | Chiang et al. .................. 438/48 |
| 6,534,356 B1 | * | 3/2003 | Yang et al. .................. 438/234 |
| 6,548,352 B1 | * | 4/2003 | Rhodes .................. 438/257 |
| 6,570,222 B2 | * | 5/2003 | Nozaki et al. .................. 257/347 |
| 6,583,484 B2 | * | 6/2003 | Pan et al. .................. 257/461 |
| 6,611,037 B1 | * | 8/2003 | Rhodes .................. 257/466 |
| 6,642,076 B1 | * | 11/2003 | Yaung et al. .................. 438/48 |
| 6,649,950 B2 | * | 11/2003 | He et al. .................. 257/292 |
| 6,723,994 B2 | * | 4/2004 | Akahori .................. 250/370.08 |
| 2001/0016378 A1 | | 8/2001 | Gonzalez et al. |
| 2002/0130348 A1 | | 9/2002 | Tran |

* cited by examiner

*Primary Examiner*—Michael Lebentritt
(74) *Attorney, Agent, or Firm*—Dickstein Shapiro Morin & Oshinsky LLP

(57) ABSTRACT

Isolation methods and devices for isolating pixels of an image sensor pixel. The isolation structure and methods include forming a biased gate over a field isolation region and adjacent a pixel of an image sensor. The isolation methods also include forming an isolation gate over substantial portions of a field isolation region to isolate pixels in an array of pixels.

96 Claims, 8 Drawing Sheets

GATED ISOLATION STRUCTURE FOR IMAGERS

FIELD OF THE INVENTION

The present invention relates generally to semiconductor devices, and more particularly, to isolation technology for use in CMOS image sensors.

BACKGROUND OF THE INVENTION

In silicon integrated circuit (IC) fabrication, it is often necessary to isolate devices that are formed in a single substrate from one another. The individual devices or circuit components subsequently are connected to other circuit elements to create a specific circuit configuration. This is true for the individual pixels of a CMOS image sensor.

A CMOS image sensor circuit includes a focal plane array of pixel cells, each one of the cells including either a photogate, photoconductor, or photodiode overlying a charge accumulation region within a substrate for accumulating photo-generated charge. Each pixel cell may include a transistor for transferring charge from the charge accumulation region to a floating diffusion node and a transistor, for resetting the diffusion node to a predetermined charge level prior to charge transference. The pixel cell may also include a source follower transistor for receiving and amplifying charge from the diffusion node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge from the floating diffusion node. Photo charge may be amplified when it moves from the initial charge accumulation region to the floating diffusion node. The charge at the floating diffusion node is typically converted to a pixel output voltage by the source follower output transistor. The photosensitive element of a CMOS image sensor pixel is typically either a depleted p-n junction photodiode or a field induced depletion region beneath a photogate.

CMOS image sensors of the type discussed above are generally known as discussed, for example, in Nixon et al., "256.times.256 CMOS Active Pixel Sensor Camera-on-a-Chip," IEEE Journal of Solid-State Circuits, Vol. 31(12), pp. 2046–2050 (1996); and Mendis et al., "CMOS Active Pixel Image Sensors," IEEE Transactions on Electron Devices, Vol. 41(3), pp. 452–453 (1994). See also U.S. Pat. Nos. 6,177,333 and 6,204,524 which describe operation of conventional CMOS imagers, the contents of which are incorporated herein by reference.

CMOS image pixels must be isolated from one another to avoid pixel cross talk. In the case of CMOS image sensors, which are intentionally fabricated to be sensitive to light, it is advantageous to provide both electrical and optical isolation between pixels.

Shallow trench isolation (STI) is one technique, which can be used to isolate pixels from one another. In general, a trench is etched into the substrate and filled with a dielectric to provide a physical and electrical barrier between adjacent pixels. Refilled trench structures, for example, are formed by etching a trench by a dry anisotropic or other etching process and then filling it with a dielectric such as a chemical vapor deposited (CVD) or high density plasma (HDP) silicon oxide or silicon dioxide ($SiO_2$). The filled trench is then planarized by a chemical mechanical planarization (CMP) or etch-back process so that the dielectric remains only in the trench and its top surface remains level with that of the silicon substrate.

To enhance the isolation further, ions can be implanted in the silicon substrate in the area directly beneath the trench. However, a drawback associated with ion implantation beneath the trench, as noted, for example, in S. Nag et al., "Comparative Evaluation of Gap-Fill Dielectrics in Shallow Trench Isolation for Sub-0.25 .mu.m Technologies," IEEE IEDM, pp. 841–844 (1996), is that ion implantation beneath the trench can result in high current leakage. In particular, when ions are implanted in the substrate close to the edges of the trench, current leakage can occur at the junction between the active device regions and the trench.

In addition to the above-mentioned drawbacks, the dominant crystallographic planes along the trench sidewalls, which have a higher silicon density, create a higher density of trap sites along the trench sidewalls compared to silicon/gate oxide interface of a transistor at the silicon surface. Trap sites on dangling bonds or broken bonds can exist at the gate electrode/oxide interface, in the bulk oxide film, the oxide substrate interface, and/or the trench insulation/active layer interface. The trap sites are normally uncharged but become energetic when electrons and holes become trapped in the trap sites. Highly energetic electrons or holes are called hot carriers. Trapped hot carriers can contribute to the fixed charge of the device and change the threshold voltage and other electrical characteristics of the device. As a result of these trap sites formed along the trench sidewalls, current generation near and along the trench sidewalls can be very high. Generation current from trap sites inside or near the photodiode depletion region contributes to the total dark current. Minimizing dark current in the photodiode is important in CMOS image sensor fabrication. Accordingly, it is desirable to provide an isolation technique that prevents current generation or current leakage.

BRIEF SUMMARY OF THE INVENTION

In one aspect, the invention provides an isolation gate formed over an isolation trench formed in an image sensor substrate for biasing the substrate at the sidewalls of the trench and providing improved isolation between adjacent pixels. In another aspect, the invention provides a substrate biasing isolation gate formed over a substantial portion of an isolation trench formed in an image sensor substrate and formed surrounding a substantial portion of a photosensitive region of an image sensor pixel formed in the substrate.

These and other features and advantages of the invention will be more apparent from the following detailed description that is provided in connection with the accompanying drawings and illustrate exemplary embodiments of the invention.

DETAILED DESCRIPTION OF THE INVENTION

In the following detailed description, reference is made to the accompanying drawings, which form a part hereof, and in which is shown by way, of illustration of specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photosensor and devices, such as transistors for converting electromagnetic radiation to an electrical signal. For purposes of illustration, a representative pixel is illustrated in the figures and description herein, and typically fabrication of all pixels in an imager will proceed simultaneously in a similar fashion.

Applicants propose several isolation techniques to minimize dark current and suppress leakage current in CMOS image sensors, as described below with reference to FIGS. 2–5. To better illustrate these techniques, a brief description of an exemplary CMOS image sensor pixel with which the invention can be used is described first with reference to FIGS. 1A and 1B hereinbelow.

Figure 1A:
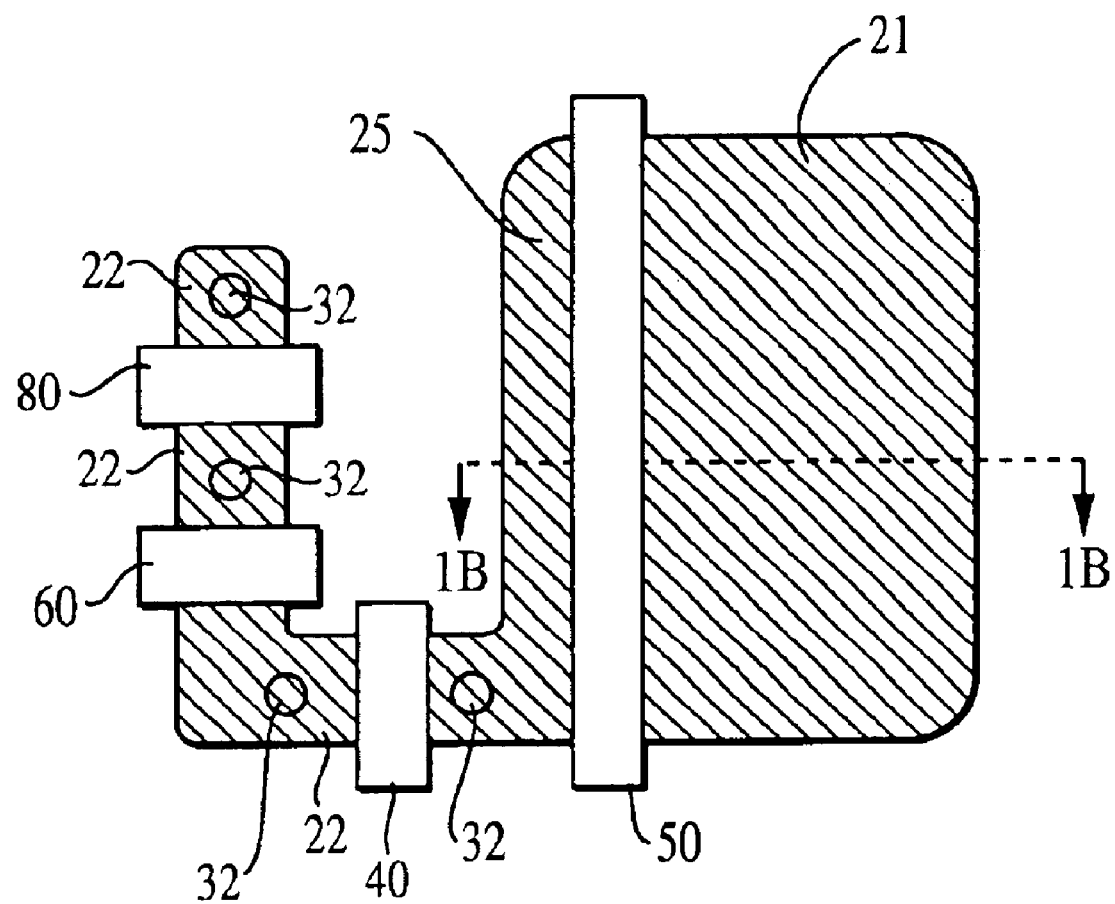
FIG. 1A is a top plan view of an exemplary CMOS image sensor fragment.
Figure 1B:
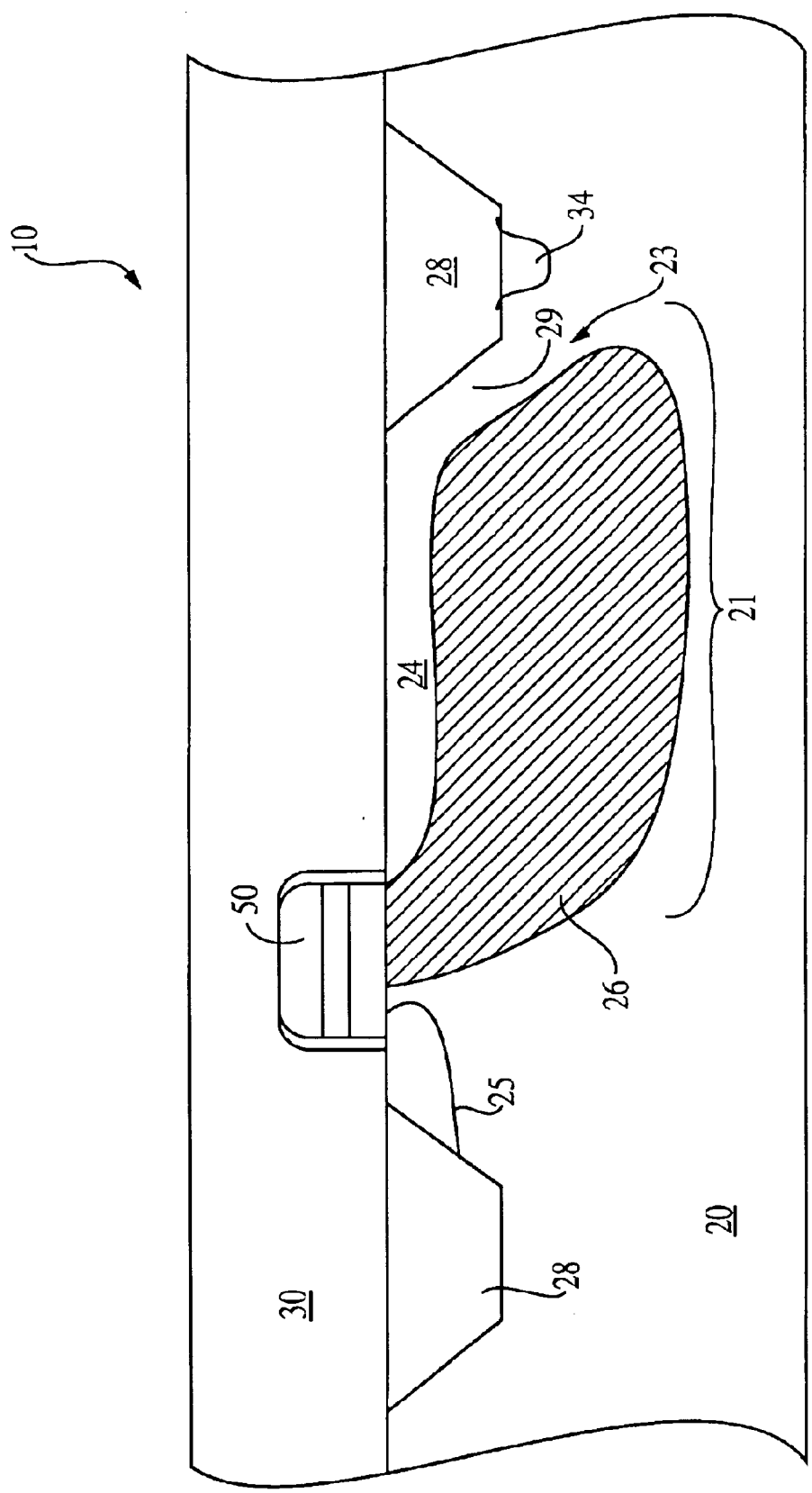
FIG. 1B is a diagrammatic side sectional view of the FIG. 1A image sensor fragment taken along line 1B—1B.

Referring now to FIGS. 1A and 1B, a semiconductor wafer fragment of an exemplary CMOS image sensor four-transistor (4T) pixel, generally designated by reference numeral 10, is shown. The CMOS image sensor pixel 10 generally comprises a transfer gate 50 for transferring photoelectric charges generated in a pinned photodiode 21 to a floating diffusion region 25 acting as a sensing node, connected to the gate of an output source follower transistor 60, a reset transistor 40 for resetting the sensing node in order to sense a next signal, and a row select transistor 80 for outputting a signal from the source follower transistor 60 to an output terminal in response to a pixel address signal.

A view of a section of the exemplary CMOS image sensor taken along line 1B—1B of FIG. 1A is shown in FIG. 1B.

The pinned photodiode is termed such since the potential in the photodiode is pinned to a constant value when the photodiode is fully depleted. The pinned photodiode has a photosensitive p-n-p junction region 21 comprising a p-type surface layer 24 and an n-type photodiode region 26 within a p-type active layer 20. The pinned photodiode includes two p-type regions 20, 24 so that the n-type photodiode region is fully depleted at a pinning voltage. Impurity doped source/drain regions 22, preferably having n-type conductivity, are provided about the gates 40, 60, 80. The floating diffusion region 25 adjacent to the transfer gate 50, is also preferably n-type.

Conventional trench isolation regions 28 are formed in the p-type substrate 20 adjacent to the p-n-p junction region 21. The trench isolation regions 28 are formed using a conventional STI process and are typically formed by etching a trench 28 in the doped active layer or substrate 20 via a directional etching process, such as Reactive Ion Etching (RIE), or etching with a preferential anisotropic etchant used to etch into the doped active layer 20 to a sufficient depth, generally about 1000 Å to 5000 Å.

The trenches are then filled with an insulating material, for example, silicon dioxide, silicon nitride, ON (oxide-nitride), NO (nitride-oxide), or ONO (oxide-nitride-oxide). The insulating materials may be formed by various chemical vapor deposition (CVD) techniques such as low pressure chemical vapor deposition (LPCVD), high density plasma (HDP) deposition, or any other suitable method for depositing an insulating material within a trench. After the trenches are filled with an insulating material, a planarizing process such as chemical mechanical polishing is used to planarize the structure. While the trench isolation regions 28 are formed by the STI process, it should be understood that the isolation regions 28 may instead be formed using the Local Oxidation of Silicon (LOCOS) process.

The gate stacks 40, 50, 60, and 80 are typically formed after the trench is formed. The order of these preliminary process steps may be varied as is required or convenient for a particular process flow, for example, if a photogate sensor which overlaps the transfer gate is desired, the gate stacks may be formed before or after the photogate; and if a nonoverlapping photogate is desired, the gate stacks may again be formed before or after photogate formation.

A translucent or transparent insulating layer 30 is formed over the CMOS image sensor. This insulating layer 30 is typically $SiO_2$, BPSU, PSG, BSG, or SOG which is planarized. Conventional processing methods are then carried out to form, for example, contacts 32 (shown in FIG. 1A) in the insulating layer 30 to provide an electrical connection to the source/drain regions 22, the floating diffusion region 25, and other wiring to connect gate lines and other connections in the pixel 10. The contact holes are then metallized to provide electrical contact to the photogate, reset gate, transfer gate, and diffusions.

In the CMOS image sensors depicted in FIGS. 1A and 1B, electrons are generated by light incident externally and collected in the photodiode region 26. The electrons are transferred to the floating diffusion region 25 and are provided as an electrical signal by the source follower transistor 60. A maximum output signal is proportional to the number of electrons to be extracted from the photodiode. The maximum output signal increases with increased electron capacitance or acceptability of the photodiode region 26. The electron capacity of pinned photodiodes typically depends on the doping level of the image sensor and the dopants implanted into the active layer.

A common problem associated with an image sensor pinned photodiode is the creation of dark current in an electrical connection region 23 along the sidewall 29 of the conventional trench isolation region 28. The electrical connection region 23 provides an electrical connection between the p-type surface layer 24 and the p-type active layer 20. Higher dopant concentrations increase the flow of holes through the connection region 23 which increases the electron accumulation capacity of the photodiode. Dark current is strongly dependent on the doping implantation conditions of the CMOS image sensor. However, the higher dopant concentrations used in conventional image sensors also increase dark current in the electrical connection region 23. The invention provides novel techniques for improved electrical connection along the electrical connection region 23 without having to increase dopant concentrations.

Another problem associated with CMOS image sensors may occur when ion implantation is used to further enhance isolation. The polysilicon gates, trench isolation regions, source/drain regions, and diffusion regions may be heavily doped after various fabrication steps via a masked ion implantation. In addition to this doping, in conventional processes, once the trench isolation regions have been formed, a masked ion implant is performed to implant ions in the areas of the substrate directly beneath the trench isolation region thus forming an implanted ion profile 34 (as shown in FIG. 1B). However, increased ion implants or doping results in an increased flat band or threshold voltage shift.

There are limits to the amount of threshold voltage shift $V_t$ that a device will tolerate before it will fail. A reference or supply voltage, for example, $V_{DD}$, to voltage shift $V_t$ margin dictates the speed of a CMOS image sensor. Accordingly, it would be ideal to have a threshold voltage shift that is as low as possible. For example, a threshold voltage shift of 0.25 mV or less is desirable for CMOS image sensors. The invention further provides novel techniques for reducing threshold voltage shifts. Although the invention is described below for use in a CMOS image sensor as the preferred embodiment, the invention is not limited to such and may be used in any suitable image sensor, for example, a CCD sensor.

Figure 2A:
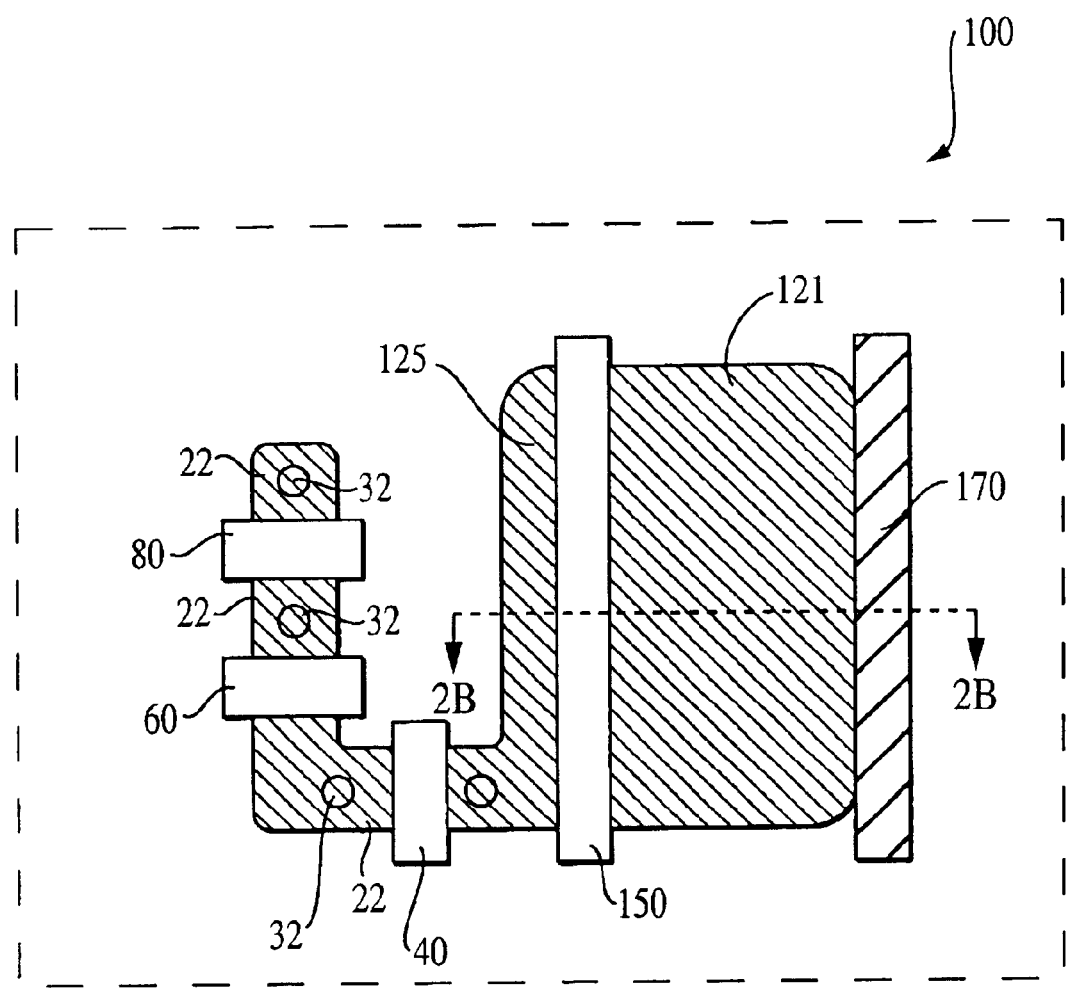
FIG. 2A is a top plan view of a CMOS image sensor fragment in accordance with a first embodiment of the invention.
Figure 2B:
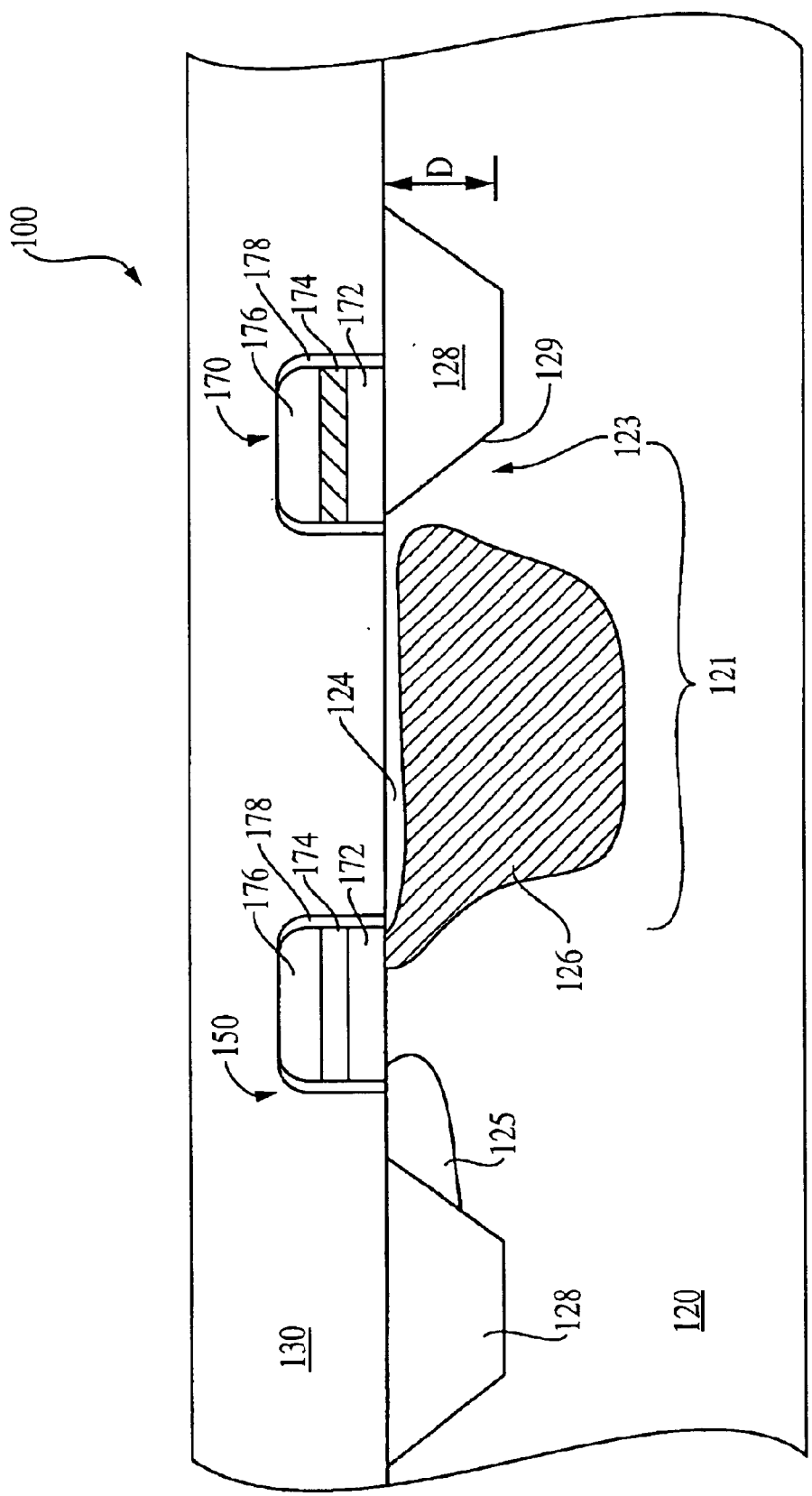
FIG. 2B is a diagrammatic side sectional view of the FIG. 2A image sensor fragment taken along line 2B—2B.

A first embodiment according to the invention is now described with reference to FIGS. 2A and 2B. A region rich in positively charged holes is created along the STI sidewall 129 without increasing the dopant levels of the active layer 120. As shown in FIGS. 2A and 2B, an isolation gate 170, generally designated 170 is provided over the trench isolation region 128 and adjacent to the p-n-p junction region 121 in order to provide separation between adjacent pixels 100. The isolation gate 170 is preferably also provided slightly over an electrical connection region 123 to provide hole accumulation in this region 123. The isolation gate 170 is preferably a stacked gate including an insulating layer 176 formed over an electrode layer 174 provided over a gate oxide layer 172. Oxide, nitride, or other insulating spacers 178 are provided on either side of the isolation gate 170.

The electrode layer 174 of the isolation gate 170 may be any type of conductor compatible with the CMOS image sensor materials chosen, and is preferably formed of the same material as the other gates. Suitable materials for the electrode layer 174 include, polysilicon, poly/TiSi$_2$, poly/WSi$_2$, poly/WN$_x$/W, poly/WN$_x$, poly/CoSi$_2$ and poly/MoSi$_2$. The isolation gate 170 may be formed at the same time as other gates, for example, the isolation gate 170, reset gate 140, the source follower 160, and the transfer gate 150 may be formed at the same time. In processes where the isolation gate 170 is formed at the same time as the other gates, it is preferred that the isolation trench regions 128 are formed prior to formation of the gates, and accordingly it is preferred that the isolation gate 170 is formed subsequent the formation of the underlying isolation trench regions 128. A translucent or transparent insulating layer 130 is formed over the CMOS image sensor. Conventional processing steps may then be carried out to complete formation of the image sensor.

The isolation gate 170 is biased by providing a grounded potential or applying a slight potential to the isolation gate. The potential may be positive or negative depending on the conductivity of the gate type electrode as explained below. Biasing the isolation gate provides electrical isolation between adjacent pixels separated by the isolation gate 170 and corresponding isolation region 128 by causing holes to accumulate in the electrical connection region 123. The accumulation of holes increases the area of the electrical connection region 123 by creating a greater separation between the photodiode region 126 and the STI sidewall 129. The accumulation of holes in the electrical connection region 123 also provides a good electrical connection from the p-type surface layer 124 to the p-type active layer 120.

Furthermore, the depth D of the trench isolation region 128 may be reduced when an isolation gate 170 is used in accordance with the invention. Generally, isolation trenches have a depth of about 2500 Å. However, the use of an isolation gate in accordance with the invention allows for the use of a trench having a depth D of less than about 2000 Å or the use of an isolation trench may be eliminated. Thus the isolation gate 170 may be formed over the active layer 120.

In accordance with the first embodiment of the invention, where doping of the source/drain regions (not shown) and the floating diffusion region 125 are doped with an n+ type conductivity material, the electrode layer 174 of the isolation gate electrode 170 is preferably n+ type polysilicon. The isolation gate 170 may be grounded or tied to a slightly negative low reference voltage. The grounded or slightly negative voltage will cause holes to accumulate under the gate in the electrical connection region 123 and provide effective isolation between pixels.

Accordingly, and also in conformance with the first embodiment of the invention, the electrode layer 174 of the isolation gate 170 may be formed of a p-type conductivity material, for example p+ polysilicon. P-type dopants have a lower penetration shift than n-type dopants. However, the use of p-type polysilicon gates shifts the CMOS threshold voltage to more positive values. The combination of the threshold voltage shift associated with the p-type polysilicon gate dopant and the threshold voltage shift associated with additional ion implant doping is excessive and leads to device failure.

Contrary to conventional processes, the present invention does not require additional implants, such as, the implanted ion profile in the areas of the substrate directly beneath the trench isolation region. Therefore, by providing an isolation gate 170 according to the invention to enhance isolation, instead of increasing active layer dopant concentrations, a p+ polysilicon gate may be used without exceeding threshold voltage limitations.

The p+ polysilicon isolation gate may be grounded or tied to a slightly positive voltage, for example, a voltage at or lower than supply voltage $V_{DD}$, to create holes along the trench sidewall and ensure that a conductive channel for electrons is not formed between pixels. A slightly positive voltage will cause the conductive channel connecting the pixels to become inverted. The grounded voltage will cause holes to accumulate in the electrical connection region 123.

Figure 3A:
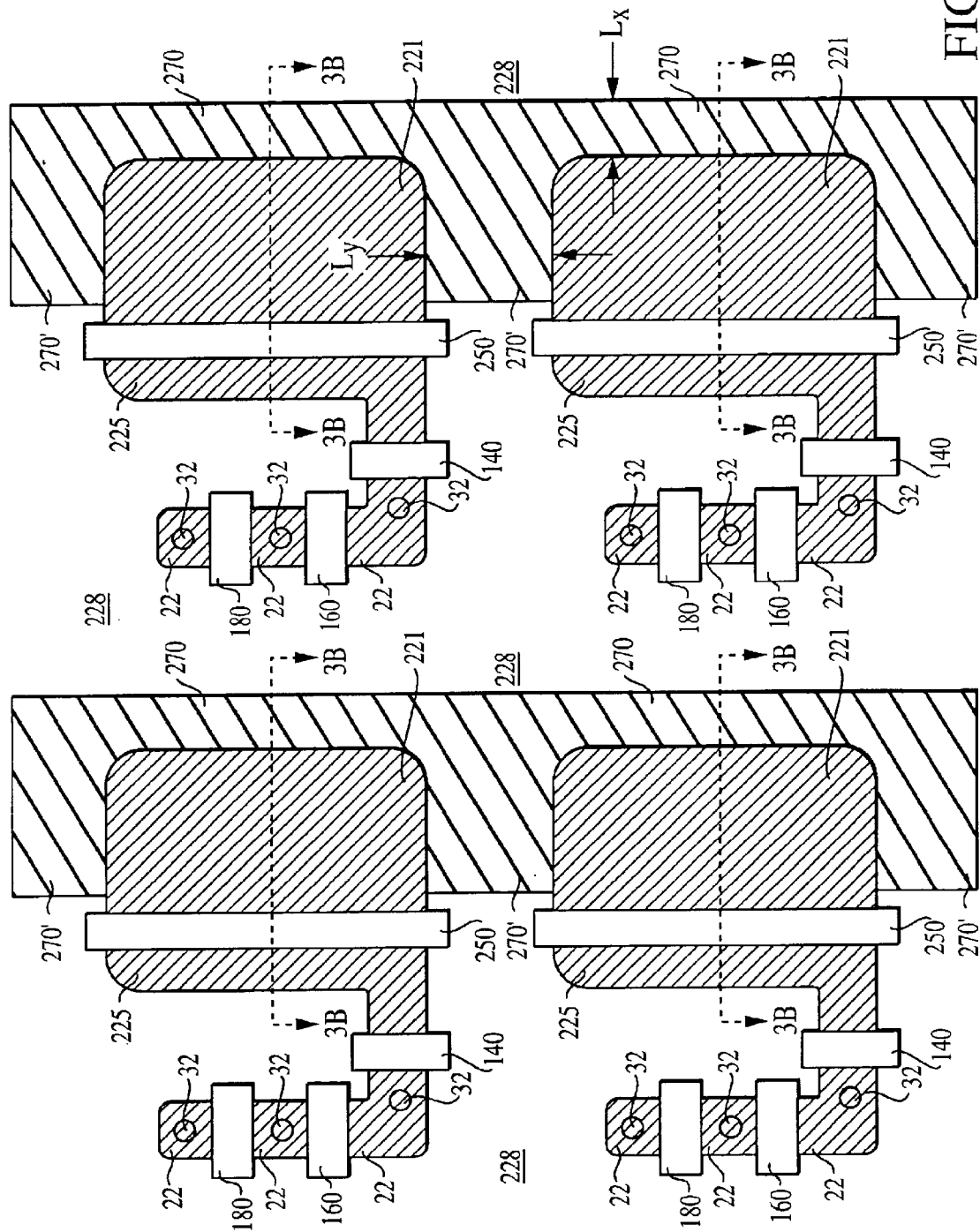
FIG. 3A is a top plan view of a CMOS image sensor fragment showing a 2×2 pixel layout in accordance with a second embodiment of the invention.
Figure 3B:
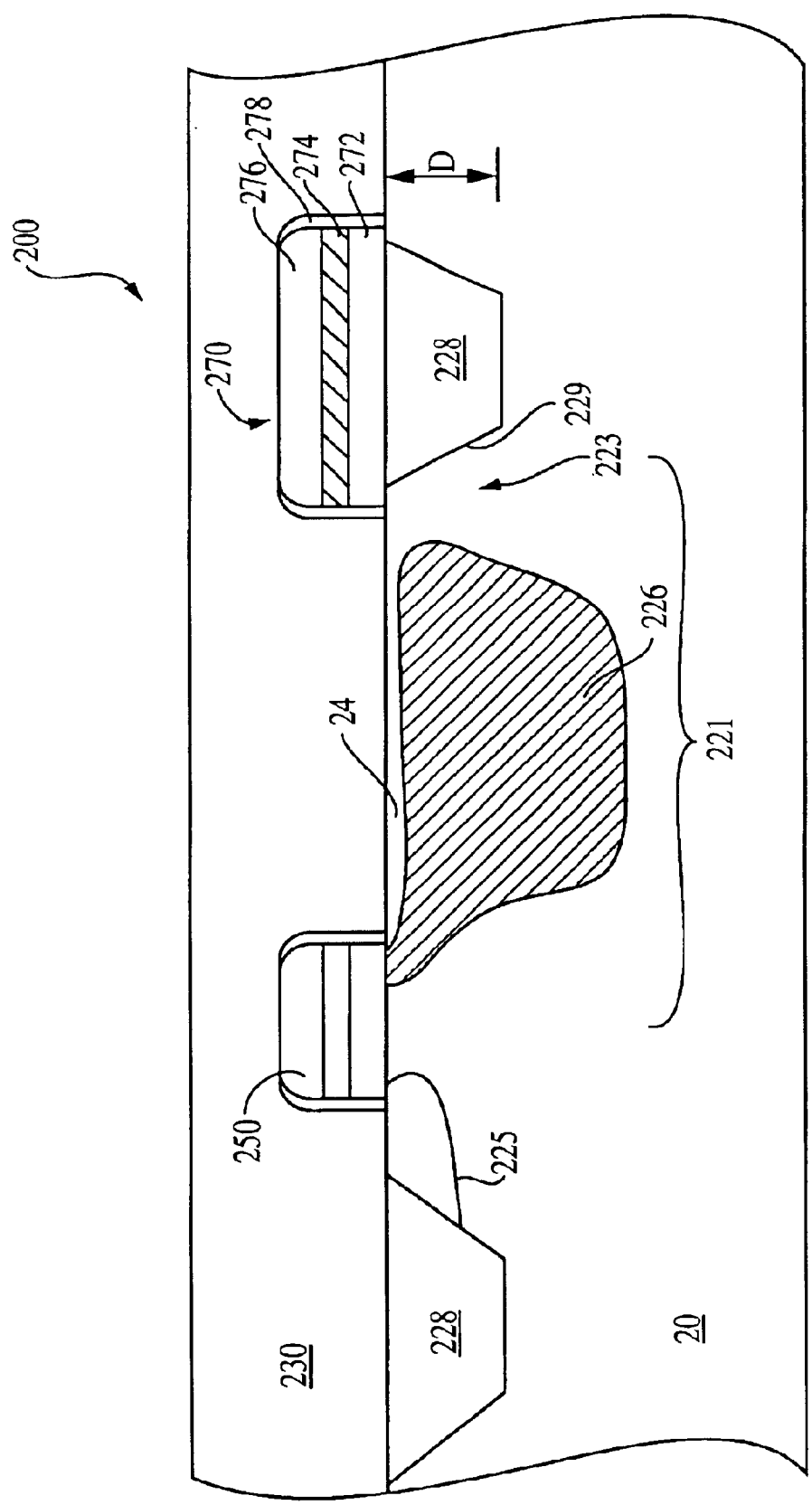
FIG. 3B is a diagrammatic side sectional view of the FIG. 3A image sensor fragment taken along line 3B—3B.

A second embodiment according to the invention is now described with reference to FIGS. 3A and 3B. A 2×2 CMOS image sensor pixel array is shown in FIG. 3A to better illustrate the invention. In accordance with the second embodiment of the invention, a region rich in positively charged holes is created along the STI sidewall 229 by providing an isolation gate 270 over the trench isolation region 228 and surrounding the p-n-p junction region 221. The isolation gate 270 is preferably provided slightly over an electrical connection region 223. The isolation gate 270 is also preferably formed to extend around the p-n-p junction region 221 to a gate, for example, transfer gate 250, but does not contact the transfer gate, so as not to short the gates. The isolation gate 270 has a length $L_x$ in the x-direction and length $L_y$ in the y-direction as shown in FIG. 3A, each of which can be modified to optimize isolation. For example, the length $L_x$ and $L_y$ of the isolation gate 270 may be independently increased or decreased to minimize dark current and cross-talk between adjacent pixels. The isolation gate 270 preferably does not extend around the floating diffusion region 225. Preferably, the isolation gate 270 extends between pixels 200, as indicated by reference numeral 270'. As shown in FIG. 3B, the isolation gate 270 may be formed over a substantial portion of the trench isolation region 228, thus allowing the formation of a shallower trench isolation region 228 that is less than about 2000 Angstroms deep as discussed above in the description of the first embodiment.

As discussed above, the isolation gate 270 may be formed of any conductive material but is preferably formed of the same material as the other gates. The isolation gate 270 may also be formed at the same time as other gates. In processes where the isolation gate 270 is formed at the same time as the other gates, it is preferred that the isolation trench regions 228 are formed prior to formation of the gates, and accordingly it is preferred that the isolation gate 270 is formed subsequent to the formation of the underlying isolation trench regions 228. A translucent or transparent insulating layer 230 is formed over the CMOS image sensor. Conventional processing steps may then be carried out to complete the image sensor. The isolation gate 270 is also biased by providing a grounded potential or applying a slight potential to the isolation gate. The potential may be positive or negative depending on the conductivity of the gate electrode layer as described below. Biasing the isolation gate provides electrical isolation between adjacent pixels separated by the isolation gate and creates accumulation of holes in the electrical connection region 223.

Also as discussed above, the isolation gate 270 is preferably a stacked gate including an insulating layer 276 formed over an electrode layer 274 provided over a gate oxide layer 272. Oxide, nitride, or other insulating spacers 278 are provided on either side of the isolation gate 270. Where doping of the source/drain region is n-type, the electrode layer 274 of the isolation gate 270, is preferably n+ polysilicon and may be grounded or tied to a slightly negative low reference voltage. Accordingly, and as explained above, the isolation gate 270 may alternatively be a p+ polysilicon gate and may be grounded or tied to a slightly positive reference voltage, for example, $V_{DD}$. Again the accumulation of holes causes the electrical connection region 223 to expand, thereby providing a greater distance between the photodiode region 226 and the trench sidewalls 229, where trap sites exist.

A simplified circuit for a CMOS image sensor is described below in accordance with the invention. The circuit, includes, for example, a photodiode for accumulating photo-generated charge in an underlying portion of the substrate. It should be understood that the CMOS image sensor may include a photogate, photoconductor, or other image to charge converting device, in lieu of a photodiode, as the initial accumulator for photo-generated charge.

Figure 4:
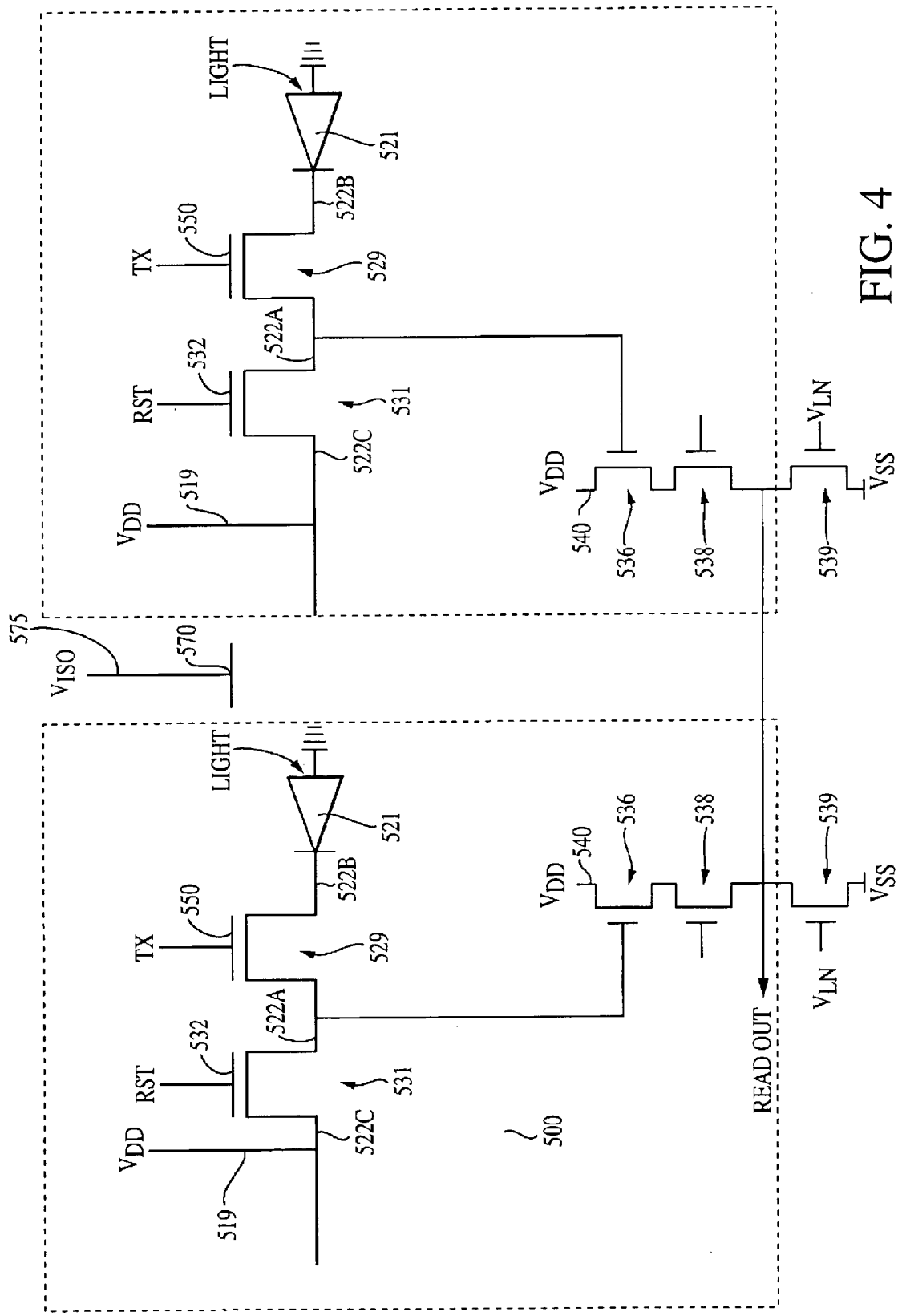
FIG. 4 is a representative pixel layout showing a 1×1 pixel layout according to an embodiment of the invention.

Referring now to FIG. 4, which shows a circuit for a 1×1 portion of a pixel array with each pixel cell being constructed in a manner shown by either of the pixels 100, 200 of FIGS. 2A–3B. The circuit of FIG. 4 shows a CMOS image sensor using a photodiode and having a pixel photo-detector circuit.

The photodetector circuit is shown in part as a cross-sectional view of a CMOS image sensor. Each pixel 500 comprises a pinned photodiode 521 for performing photo-electric conversion. Transfer gates 550 are formed between n-type source/drain regions 522A, 522B. The transfer gate 550 and n-type source/drain regions 522A, 522B form the charge transfer transistors 529 which are controlled by a transfer signal TX. The n-type region 522A acts as a floating diffusion region. Reset gates 532 are formed between the n-type source/drain regions 522A, 522C. The reset gates and the source/drain regions 522A, 522C form reset transistors 531 which are controlled by a reset signal RST. The n-type source/drain region 522C is coupled to a voltage source $V_{DD}$ via a conductor 519. It should be noted that while FIG. 4 shows the use of a transfer gate 550 and associated transistor 529, the transfer transistor 529 provides advantages, but is not required. Thus, the invention may be used in a three transistor (3T) environment where the transfer gate is omitted and the n-type charge collection region of the photodiode is converted with the n-type diffusion region 522A.

Isolation is provided between adjacent pixels by an isolation gate 570. The isolation gate 570 is coupled to a reference voltage $V_{ISO}$. The reference voltage $V_{ISO}$ biases the isolation gate 570 off to accumulate holes in the electrical connection regions of the pixels. Typically, the isolation gate 570 is biased by tying the reference voltage $V_{ISO}$ to ground potential. Where an n-type material is used to form the isolation gate 570, the isolation gate 570 can be turned off "harder" by setting the reference voltage $V_{ISO}$ to a voltage more negative than ground. Alternatively, where a p-type isolation gate 570 is used, the isolation gate 570 can be turned off "harder" by setting the reference voltage $V_{ISO}$ to a voltage more positive than ground. Applying a voltage that is more negative (for n-type isolation gates) or more positive (for p-type isolation gates) than ground will turn the isolation transistor off harder to help turn off a sub-threshold leakage path. Accordingly, a supply voltage $V_{DD}$ can be used to provide a more positive potential. A typical supply voltage can range up to about 5 volts. The isolation gate 570 is provided to prevent leakage between adjacent pixels 500. Therefore, while illustrated as lying between adjacent pixels 500, it should be understood that the isolation gate 570 can be applied anywhere on the device calculated to prevent leakage effects of one pixel 500 to the next.

The pixel also includes additional transistors, for example, a source follower transistor 536 and a row select transistor 538. The transistors 536, 538 are coupled in series source to drain, with the source of the source follower transistors 536 also coupled over leads 540 to the voltage source $V_{DD}$ and the drain of the row select transistors 538 coupled to leads 542. The drain of the row select transistors 538 are connected via leads 542 to the drains of similar row select transistors for other pixels in a given pixel row. Load transistors 539 are also coupled between the drains of the transistors 538 and a voltage source $V_{SS}$. The transistors 539 are kept on by a signal $V_{LN}$ applied to their gates.

It should be noted that in many transistors, the source and drain are essentially interchangeable, and interconnections specified herein should not be interpreted as solely limited to those described. In addition, while the transistors have been described as n-type or n-channel, it is recognized by those skilled in the art that a p-type or p-channel transistor may also be used if the structures are uniformly oppositely doped from that described. The n and p designations are used in the common manner to designate donor and acceptor type impurities which promote electron and hole type carriers respectively as the majority carriers. The "+" symbol, when used as a suffix with an impurity type shall be interpreted to mean that the doping concentration of that impurity is heavier than the doping associated with just the letter identifying the impurity type without the "+" suffix.

Figure 5:
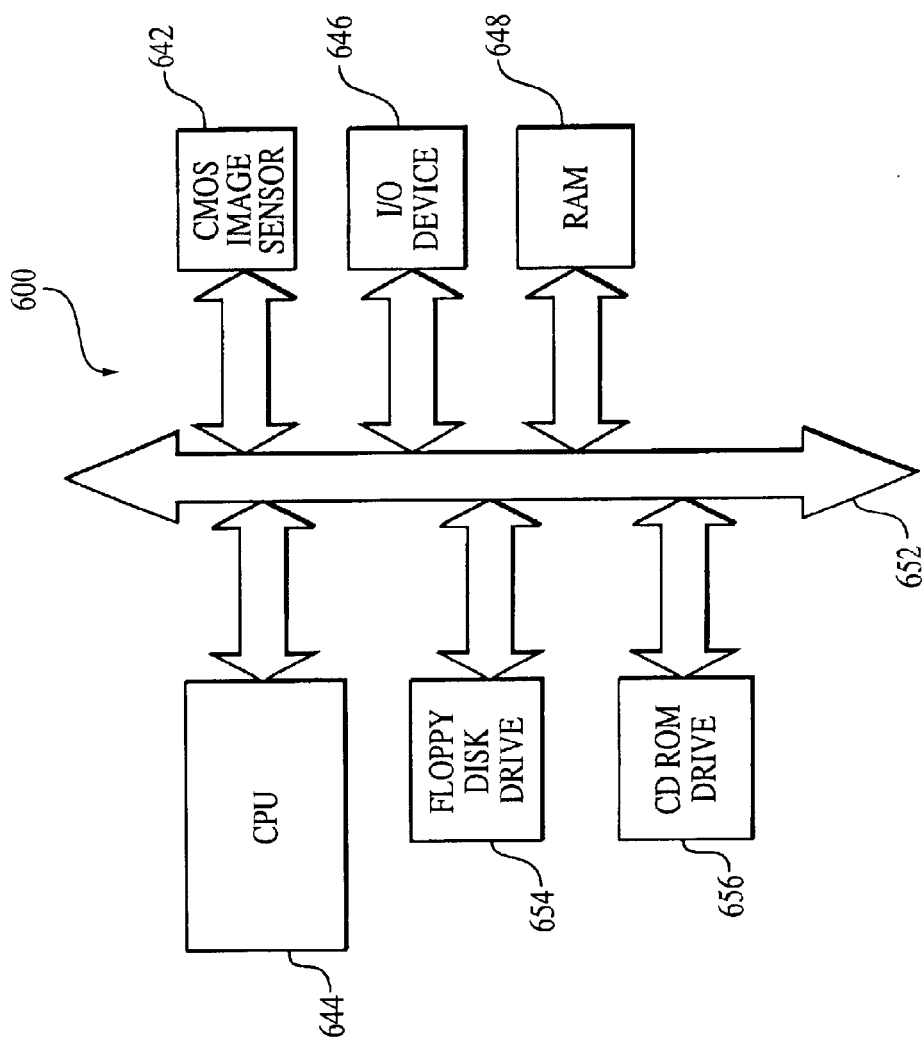
FIG. 5 is a schematic diagram of a processor system incorporating an image sensor constructed in accordance with the invention.

A typical processor based system, which includes a CMOS image sensor according to the invention is illustrated generally at 642 in FIG. 5. A processor based system is exemplary of a system having digital circuits which could include CMOS image sensors. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises a central processing unit (CPU) 644, for example, a microprocessor, that communicates with an input/output (I/O) device 646 over a bus 652. The CMOS image sensor 642 also communicates with the system over bus 652. The computer system 600 also includes random access memory (RAM) 648, and, in the case of a computer system may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image sensor 642 and memory 648 on a single IC chip.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed is:

1. An image sensor comprising:
    a pixel comprising a photosensitive region;
    an isolation region adjacent said pixel; and
    an isolation gate provided over said isolation region for accumulating charge in a region adjacent to said isolation.

2. The sensor of claim 1 wherein said pixel further comprises at least one transistor gate for transferring photoelectric charges from said photosensitive region and wherein said isolation gate is of the same conductivity type as said at least one transistor gate.

3. The sensor of claim 1 wherein said photosensitive region, comprises a p-type conductivity substrate, an n-type conductivity photodiode region, and a p-type conductivity surface region.

4. The sensor of claim 3 wherein said isolation gate extends over at least a portion of a region between said photosensitive region of said pixel and said isolation region and said isolation gate is biased to accumulate holes in said region between said photosensitive region of said pixel and said isolation region.

5. The sensor of claim 3 wherein said isolation gate is biased to expand a region between said photosensitive region of said pixel and said isolation region.

6. The sensor of claim 1 wherein said isolation gate is biased to ground.

7. The sensor of claim 1 wherein said isolation gate is biased to a negative potential.

8. The sensor of claim 1 wherein said isolation gate is biased to provide electrical isolation between adjacent pixels.

9. The sensor of claim 1 wherein said isolation gate has an n-type conductivity.

10. The sensor of claim 9 wherein said n-type isolation gate is biased to a negative reference voltage.

11. The sensor of claim 1 wherein said isolation gate has a p-type conductivity.

12. The sensor of claim 11 wherein said p-type isolation gate is biased to a positive voltage.

13. The sensor of claim 12 wherein said positive voltage is about 5 volts or less.

14. The sensor of claim 1 wherein said isolation region comprises a trench having a depth of 5000 Å or less.

15. The sensor of claim 1 wherein said isolation region does not comprise a trench.

16. The sensor of claim 1 wherein said isolation region comprises an active area.

17. The sensor of claim 1 wherein said photosensitive region comprises a photosensor.

18. The sensor of claim 1 wherein said photosensitive region comprises a photodiode.

19. The sensor of claim 1 wherein said photosensitive region comprises a photogate.

20. The sensor of claim 1 wherein said photosensitive region comprises a photoconductor.

21. The sensor of claim 1 wherein said image sensor comprises a CMOS image sensor.

22. The sensor a claim 21 wherein said CMOS image sensor comprises a three transistor (3T) CMOS image sensor.

23. The sensor of claim 21 wherein said CMOS image sensor comprises a four transistor (4T) CMOS image sensor.

24. The sensor of claim 1 wherein said image sensor comprises a CCD image sensor.

25. An image sensor, said image sensor comprising:
    an active layer of a first conductivity type formed within a substrate;
    at least one transistor gate formed over a portion of said active layer;
    a photosensor formed adjacent to said transistor gate;
    an isolation region formed in said active layer adjacent to said photosensor, wherein said isolation region comprises a portion of said active layer; and
    an isolation gate formed over at least a portion of said isolation region.

26. The sensor of claim 25 wherein said photosensor comprises a p-n-p junction region formed under said at least one transistor gate, said p-n-p junction region comprising a surface layer of said first conductivity type overlying a photosensitive region of a second conductivity type, said photosensitive region overlying said active layer of said first conductivity type.

27. The sensor of claim 26 wherein said isolation region is formed in said active layer adjacent to said p-n-p junction region.

28. The sensor of claim 25 wherein said photosensor comprises a photodiode.

29. The sensor of claim 25 wherein said photosensor comprises a photogate.

30. The sensor of claim 25 wherein said photosensor comprises a photoconductor.

31. The sensor of claim 25 wherein said photosensor comprises a p-n-p diode.

32. The sensor of claim 25 wherein said photosensor comprises a buried diode.

33. The sensor of claim 25 wherein said isolation region comprises a trench having a depth of 4000 Å or less.

34. The sensor of claim 25 wherein said isolation region does not comprise a trench.

35. The sensor of claim 25 wherein said transistor gate has an n-type conductivity.

36. The sensor of claim 25 wherein said isolation gate has a p-type conductivity.

37. The sensor of claim 26 wherein said isolation gate is biased to accumulate holes in a connection region formed between said p-n-p junction region and said isolation region.

38. The sensor of claim 25 wherein said isolation gate is biased to a ground potential.

39. The sensor of claim 36 wherein said isolation gate is biased to a negative voltage potential.

40. The sensor of claim 37 wherein said isolation gate is biased to a positive voltage potential.

41. The sensor of claim 25 wherein said isolation gate assists in isolating said photosensor from an adjacent active area containing another photosensor.

42. The sensor of claim 25 wherein said isolation region comprises a trench having sidewalls, said trench being filled with an insulating material.

43. The sensor of claim 42 wherein said isolation gate is biased to create positively charged holes along a sidewall of said trench.

44. The sensor of claim 25 wherein said transistor gate is a transfer gate.

45. A processor based system comprising the sensor of claim 25.

46. A CMOS image sensor comprising:
a pixel for receiving incident photo energy and converting it into an electrical signal;
said pixel comprising:
a photosensitive area for accumulating photo-generated charge;
a floating diffusion region adjacent a side of said photosensitive area for receiving charge from said photosensitive area;
a read out circuit comprising at least an output transistor for reading out charge from said floating diffusion region;
an isolation region formed around at least a portion of said pixel; and
an isolation gate formed over at least a portion of said isolation region, wherein said isolation gate substantially surrounds said photosensitive area.

47. The image sensor of claim 46 wherein said isolation gate is of a same conductivity type as a gate of said output transistor.

48. The image sensor of claim 46 wherein said isolation gate has an n-type conductivity.

49. The image sensor of claim 46 wherein said isolation gate has a p-type conductivity.

50. The image sensor of claim 46 wherein said isolation gate is biased to a ground potential.

51. The image sensor of claim 48 wherein said isolation gate is biased to a negative potential.

52. The image sensor of claim 49 wherein said isolation gate is biased to a positive potential.

53. The image sensor of claim 46 wherein said isolation region comprises a trench having a depth of 4000 Å or less.

54. The image sensor of claim 46 wherein said isolation region does not comprise a trench.

55. The image sensor of claim 46 wherein said isolation region is an active area.

56. The image sensor of claim 46 wherein said isolation gate is formed over a substantial portion of said isolation region.

57. The image sensor of claim 46 wherein said photosensitive area comprises a photodiode.

58. The image sensor of claim 46 wherein said photosensitive area comprises a photogate.

59. The image sensor of claim 46 wherein said photosensitive area comprises a photoconductor.

60. The image sensor of claim 57 wherein said photosensitive area comprises a p-n-p diode.

61. The image sensor of claim 57 wherein said photosensitive area comprises a buried diode.

62. An image sensor comprising:
a semiconductor substrate having a plurality of image sensor pixels formed thereon;
each of said pixels comprising a photosensitive region and a floating diffusion region;
an active area formed between adjacent pixels; and
at least one isolation gate formed over a portion of said active area, wherein said isolation gate is biasable for accumulating holes in a portion of said active area between said photosensitive region and said isolation gate.

63. The sensor of claim 62 wherein said pixel comprises at least one transistor gate for transferring photoelectric charges and wherein said isolation gate is of the same conductivity type as said at least one transistor gate.

64. The sensor of claim 62 wherein said photosensitive region comprising a p-type conductivity substrate, an n-type conductivity photodiode region, and a p-type conductivity surface region.

65. The sensor of claim 62 wherein said isolation gate is biased to ground.

66. The sensor of claim 62 wherein said isolation gate is biased to a negative potential.

67. The sensor of claim 62 wherein said isolation gate is biased to provide electrical isolation between adjacent pixels.

68. The sensor of claim 62 wherein said isolation gate has an n-type conductivity.

69. The sensor of claim 68 wherein said n-type isolation gate is biased to a negative reference voltage.

70. The sensor of claim 62 wherein said isolation gate has a p-type conductivity.

71. The sensor of claim 70 wherein said p-type isolation gate is biased to a positive voltage.

72. The sensor of claim 71 wherein said positive voltage is about 5 volts or less.

73. An integrated circuit comprising:
a semiconductor substrate having a plurality of image sensor pixels formed thereon;
each of said pixels comprising a photosensitive region and a floating diffusion region;
an isolation region formed between adjacent pixels;
at least one isolation gate formed over a portion of said isolation region, said isolation gate being biasable to a constant voltage such that the isolation gate constantly reverse biases the isolation region.

74. The circuit of claim 73 wherein said isolation region comprises a trench having a depth of 4000 Å or less.

75. The circuit of claim 73 wherein said isolation region does not comprise a trench.

76. The circuit of claim 73 wherein said isolation region is an active area.

77. The circuit of claim 73 wherein said isolation region comprises an insulation filled trench having sidewalls.

78. The circuit of claim 77 wherein said voltage causes holes to accumulate in a region between said photosensitive region and said sidewalls of said trench.

79. The circuit of claim 73 wherein said pixels further comprise a transfer gate between said photosensitive region and said floating diffusion region.

80. The circuit of claim 79 wherein said transfer gate and said isolation gate are of the same conductivity type.

81. The circuit of claim 73 wherein said isolation gate has an n-type conductivity.

82. The circuit of claim 73 wherein said isolation gate has a p-type conductivity.

83. The circuit of claim 73 wherein said constant voltage is a ground potential.

84. The circuit of claim 81 wherein said constant voltage is a negative potential.

85. The circuit of claim 82 wherein said constant voltage is a positive potential.

86. The circuit of claim 79 wherein said isolation gate surrounds a substantial portion of said pixels but does not contact said transfer gate or said floating diffusion region.

87. An image sensor comprising:
a substrate having a doped layer of a first conductivity type;
an array of pixel sensor cells formed in said doped layer;
an isolation region formed between each pixel sensor cell; and
an isolation gate formed over a substantial portion of said isolation region, said isolation gate being formed over at least a portion of said doped layer.

88. An integrated circuit comprising:
a semiconductor substrate having an image sensor pixel formed thereon;
said pixel comprising at least one transfer gate disposed over and between a floating diffusion region and a photosensitive active region;
an isolation channel formed in said substrate and between said pixel and an adjacent pixel; and
an isolation gate formed over said isolation channel, whereby said isolation gate extends around substantially all of said photosensitive active region, the isolation gate being biasable by a voltage such that the isolation gate biases the isolation channel.

89. The integrated circuit of claim 88 wherein the isolation region comprises a filled trench, said filled trench being less than about 0.7 microns deep.

90. The integrated circuit of claim 88 wherein said transfer gate and said isolation gate are formed of a same conductivity type.

91. The integrated circuit of claim 88 wherein said voltage is a ground potential.

92. The integrated circuit of claim 88 wherein said isolation gate is formed of an n-type conductivity material.

93. The integrated circuit of claim 88 wherein said voltage is a negative potential.

94. The integrated circuit of claim 88 wherein said isolation gate is formed of a p-type conductivity material.

95. The integrated circuit of claim 94 wherein said voltage is a positive potential.

96. The integrated circuit of claim 88 wherein said isolation gate is biased to accumulate holes in a connection region between said photosensitive active region and said isolation region.

* * * * *